US006803611B2

(12) United States Patent
Rotondaro et al.

(10) Patent No.: US 6,803,611 B2
(45) Date of Patent: Oct. 12, 2004

(54) USE OF INDIUM TO DEFINE WORK FUNCTION OF P-TYPE DOPED POLYSILICON

(75) Inventors: Antonio Luis Pacheco Rotondaro, Dallas, TX (US); James J. Chambers, Dallas, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/336,563

(22) Filed: Jan. 3, 2003

(65) Prior Publication Data

US 2004/0129988 A1 Jul. 8, 2004

(51) Int. Cl.[7] .............................................. H01L 27/10
(52) U.S. Cl. ....................... 257/204; 257/250; 257/285; 257/357
(58) Field of Search ................................. 257/204, 250, 257/285, 357, 366, 412; 438/199, 285, 290, 527

(56) References Cited

U.S. PATENT DOCUMENTS

| 5,854,139 | A | | 12/1998 | Aratani et al. |
| 6,124,620 | A | * | 9/2000 | Gardner et al. ............. 257/411 |
| 6,136,655 | A | | 10/2000 | Assaderaghi et al. |
| 6,159,810 | A | * | 12/2000 | Yang ........................... 438/301 |
| 6,265,258 | B1 | * | 7/2001 | Liang et al. ................. 438/217 |
| 6,653,699 | B1 | * | 11/2003 | Yang ........................... 257/412 |
| 6,667,525 | B2 | * | 12/2003 | Rhee et al. .................. 257/407 |
| 2003/0082863 | A1 | * | 5/2003 | Lim et al. .................... 438/199 |
| 2003/0146457 | A1 | * | 8/2003 | Hoshino et al. ............. 257/250 |
| 2003/0201499 | A1 | * | 10/2003 | Komatsu ...................... 257/368 |

* cited by examiner

Primary Examiner—George Fourson
Assistant Examiner—Michelle Estrada
(74) Attorney, Agent, or Firm—Peter K. McLarty; W. James Brady, III; Frederick J. Telecky, Jr.

(57) ABSTRACT

The present invention pertains to formation of a PMOS transistor wherein a layer of silicon or SiGe inhibits p-type dopant from entering into an underlying gate dielectric layer. The p-type dopant can be added to a gate electrode material that overlies the silicon or SiGe layer and can diffuse down toward the silicon or SiGe layer. The layer of silicon or SiGe may be formed to a thickness of about 5 to 120 nanometers and doped with a dopant, such as indium (In), for example, to deter the p-type dopant from passing through the silicon or SiGe layer. The dopant may have a peak concentration within the layer of silicon or SiGe near the interface of the silicon or SiGe layer with the underlying layer of gate dielectric material. Allowing the gate electrode to be doped with the p-type dopant (e.g., boron) facilitates forming the transistor with an associated work function having a desired value (e.g., coincident with a Fermi level of about 4.8 to about 5.6 electron volts).

4 Claims, 12 Drawing Sheets

USE OF INDIUM TO DEFINE WORK FUNCTION OF P-TYPE DOPED POLYSILICON

FIELD OF INVENTION

The present invention relates generally to semiconductor processing, and more particularly to a methodology for isolating a silicon dioxide, silicon oxynitride or high-k gate dielectric from a p-type dopant such as boron added to an overlying gate electrode in a PMOS transistor.

BACKGROUND OF THE INVENTION

In the semiconductor industry, there is a continuing trend toward manufacturing integrated circuits (ICs) with a greater number of layers and with higher device densities. To achieve these high densities there have been, and continues to be, efforts towards reducing the thickness of layers, improving the uniformity of layers, reducing the thickness of devices and scaling down device dimensions (e.g., at sub micron levels) on semiconductor wafers. In order to accomplish such higher device packing densities, thinner layers, more uniform layers, smaller feature sizes, and smaller separations between features are required. This can include the thickness of gate dielectric materials (e.g., $SiO_2$), the width and spacing of interconnecting lines, the spacing and diameter of contact holes, and the surface geometry such as corners and edges of various features. The scaling-down of integrated circuit dimensions can facilitate faster circuit performance, and can lead to higher effective yield in IC fabrication by providing more circuits on a die and/or more die per semiconductor wafer. Such advantages are a driving force to constantly scale down IC dimensions.

The process of manufacturing integrated circuits typically consists of more than a hundred steps, during which hundreds of copies of an integrated circuit can be formed on a single wafer. Generally, the process involves creating several layers on and in a substrate that ultimately forms the complete integrated circuit. This layering process can create electrically active regions in and on the semiconductor wafer surface. In MOS transistors, for example, a gate structure is created, which can be energized to establish an electric field within a semiconductor channel, by which current is enabled to flow between a source region and a drain region within the transistor. The source and drain regions facilitate this conductance by virtue of containing a majority of p or n type materials. The regions are typically formed by adding dopants to targeted areas on either side of the channel region in a semiconductor substrate. The gate structure includes a gate dielectric and a contact or gate electrode. The gate contact generally includes metal or doped polysilicon or polysilicon germanium (SiGe) and is formed over the gate dielectric, which is itself formed over the channel region. The gate dielectric is an insulator material, which prevents large currents from flowing from the gate electrode into the channel when a voltage is applied to the gate contact, while allowing an applied gate voltage to set up an electric field within the channel region in a controllable manner.

Transistors are physically very small in many cases, whereby many such devices may be formed on a single-crystal silicon substrate (which can include a base semiconductor wafer and any epitaxial layers or other type semiconductor layers formed thereover or associated therewith) and interconnected in an integrated circuit. Nevertheless, the size of the transistors and other electrical components is continually decreasing to improve device density. However, certain properties of the materials utilized to form the transistors limit the size to which the transistors can be reduced. By way of example, properties of silicon dioxide ($SiO_2$), which is commonly used to form the layer comprising the gate dielectric in transistors, can limit the degree to which the thickness of the gate dielectric can be reduced. For instance, extremely thin $SiO_2$ layers allow for significant gate leakage currents due to direct tunneling of charge carriers through the oxide. Thus, it has been found that operating parameters may change dramatically due to slight variations in gate dielectric thickness.

Furthermore, thin gate dielectric layers are known to provide poor diffusion barriers to impurities. Thus, for example, extremely thin $SiO_2$ gate dielectric layers suffer from high boron penetration into the underlying channel region during doping of the gate electrode and source/drain regions. Such doping also degrades the gate oxide, rendering it more susceptible to leakage. Previous efforts at device scaling have focused on the addition of nitrogen into the silicon dioxide gate dielectric, however, recent efforts have focused on alternative dielectric materials that can be formed in a thicker layer than silicon dioxide layers and yet still produce the same field effect performance. These materials are often referred to as high-k materials because their dielectric constants are greater than that of $SiO_2$. The relative performance of such high-k materials is often expressed as equivalent oxide thickness (EOT) because the alternative material layer may be thicker, while providing the equivalent electrical effect of a much thinner layer of $SiO_2$. Accordingly, high-k dielectric materials can be utilized to form gate dielectrics, where the high-k materials facilitate a reduction in device dimensions while maintaining a consistency of desired device performance.

High-k dielectrics have also been found to suffer from boron penetration during doping of the overlying gate electrode in PMOS transistors, and such boron contamination negatively impacts the EOT thereof as well as transistor performance parameters. Therefore there is a need for improved transistor devices and methods of manufacture that do not suffer the negative impacts of boron penetration.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later.

The present invention pertains to formation of a PMOS transistor wherein a layer of silicon or SiGe deters a p-type dopant such as boron that is added to an overlying gate electrode material from diffusing into the layer of silicon or SiGe and into an underlying high-k dielectric layer. The layer of silicon or SiGe may be formed to a thickness of about 5 to 120 nanometers and doped with a dopant, such as indium (In), for example, to inhibit the boron from passing through the silicon or SiGe layer. The silicon or SiGe layer dopant may have a peak concentration within the layer of silicon or SiGe near the interface of the silicon or SiGe layer with the underlying layer of gate dielectric material. Allowing the gate electrode to be doped with the p-type dopant (e.g., boron) facilitates forming the transistor with an associated work function having a desired value (e.g., coincident with a Fermi level of about 4.8 to about 5.6 electron volts).

According to one aspect of the present invention, a method of forming a PMOS transistor initially includes forming a gate dielectric layer over a semiconductor substrate. A silicon or SiGe layer is then formed over the gate dielectric layer. The silicon or SiGe layer is doped with an isolating dopant to inhibit boron from passing through the silicon or SiGe layer and diffusing into the underlying gate dielectric layer. A gate electrode layer is then formed over the silicon or SiGe layer. The gate electrode layer, silicon or SiGe layer and gate dielectric layer are then patterned to form a gate structure. The patterned gate electrode layer is doped with boron to establish a desired work function associated with the transistor, and exposed portions of the substrate adjacent the gate structure are doped to form source and drain regions in the semiconductor substrate on opposite sides of the gate structure. A channel is also thereby defined within the substrate under the gate structure when the substrate is doped to form the source and drain regions.

In accordance with another aspect of the present invention, a method of forming a PMOS transistor includes forming a gate dielectric over a semiconductor body. Then, a silicon or SiGe layer is formed over the high-k dielectric, wherein the silicon or SiGe layer is doped with a p-type dopant that is not boron. A polysilicon or SiGe layer is then formed over the silicon or SiGe layer, wherein the polysilicon or SiGe layer is doped with boron, and wherein the silicon or SiGe layer and the polysilicon or SiGe layer together comprise a gate. Source and drain regions are formed in the semiconductor body on opposing sides of the gate, and a channel region is thereby defined within the substrate between the source and drain regions.

According to yet another aspect of the present invention, a PMOS transistor includes a source region formed within a substrate and a drain region formed within the substrate. A channel region is also thereby defined within the substrate between the source and drain regions. The transistor further includes a high-k gate dielectric formed over the channel region, a silicon or SiGe layer formed over the gate dielectric and a gate electrode formed over the silicon or SiGe layer. The gate electrode is doped with a p-type dopant such as boron to establish a desired work function associated with the transistor. The silicon or SiGe layer inhibits the boron from entering into the gate dielectric.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
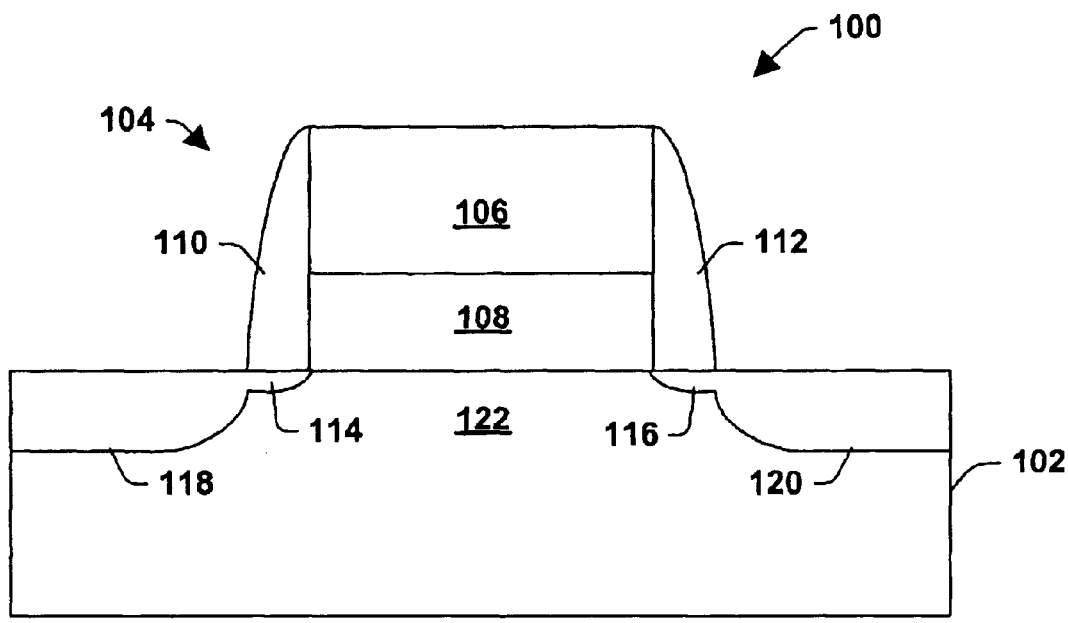
FIG. 1 is a simplified, schematic cross-sectional illustration of a conventional PMOS transistor.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to formation of a PMOS transistor wherein a layer of silicon or SiGe inhibits a p-type dopant such as boron from entering into an underlying gate dielectric layer. The p-type dopant can be added to a gate electrode material that overlies the silicon or SiGe layer and can diffuse down toward the silicon or SiGe layer. The layer of silicon or SiGe may be formed to a thickness of about 5 to 120 nanometers and doped with a dopant, such as indium (In), for example, to deter the p-type dopant from passing through the silicon or SiGe layer. The dopant may have a peak concentration within the layer of silicon or SiGe near the interface of the silicon or SiGe layer with the underlying layer of gate dielectric material.

FIG. 1 illustrates a conventional semiconductor transistor 100 that can be fabricated with conventional complimentary MOS (CMOS) processing techniques in a semiconductor substrate 102. It is to be appreciated that the term "semiconductor substrate" as used herein can include a base semiconductor wafer (e.g., silicon or SiGe) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that shown herein.

The device 100 includes a gate structure 104 comprising a gate electrode 106 and a gate dielectric 108. The gate 106 generally comprises polysilicon or SiGe and overlies the gate dielectric 108. Sidewall spacers 110, 112 are located upon either side of the gate structure 104. As will be discussed further, the sidewall spacers 110, 112 impede doping of certain areas or extension regions 114, 116 underlying the spacers 110, 112. Two laterally spaced doped source/drain regions 118 and 120 are formed within the substrate 102 and a channel region 122 is defined therebetween under the gate structure 104.

In operation, the resistivity of the channel 122 may be controlled by a voltage applied to the gate electrode 106, where changing the gate voltage changes the amount of current flowing through the channel 122 between the source and drain. The gate contact or 106 and the channel 122 are separated by the gate dielectric 108, which is an insulator and which opposes current flow between the gate 106 and the channel 122, such that the device does not become activated until a sufficient threshold voltage $V_t$ is applied to the gate electrode 106.

Figure 2:
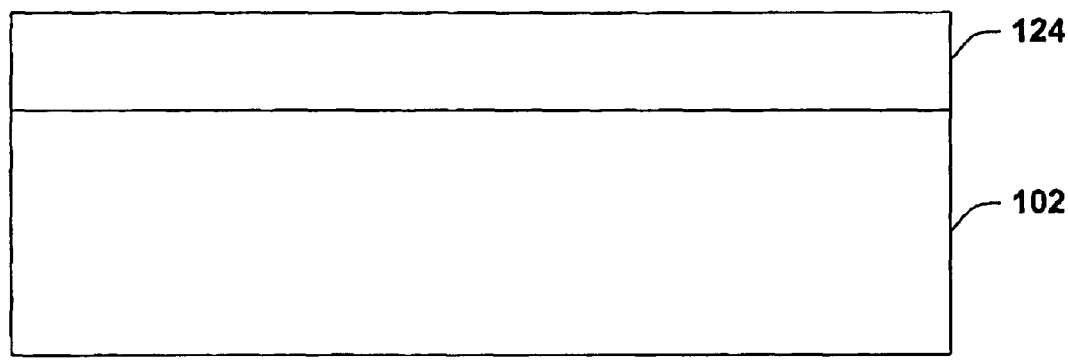
FIGS. 2–10 are cross-sectional illustrations depicting a conventional methodology for forming a PMOS transistor.
Figure 3:
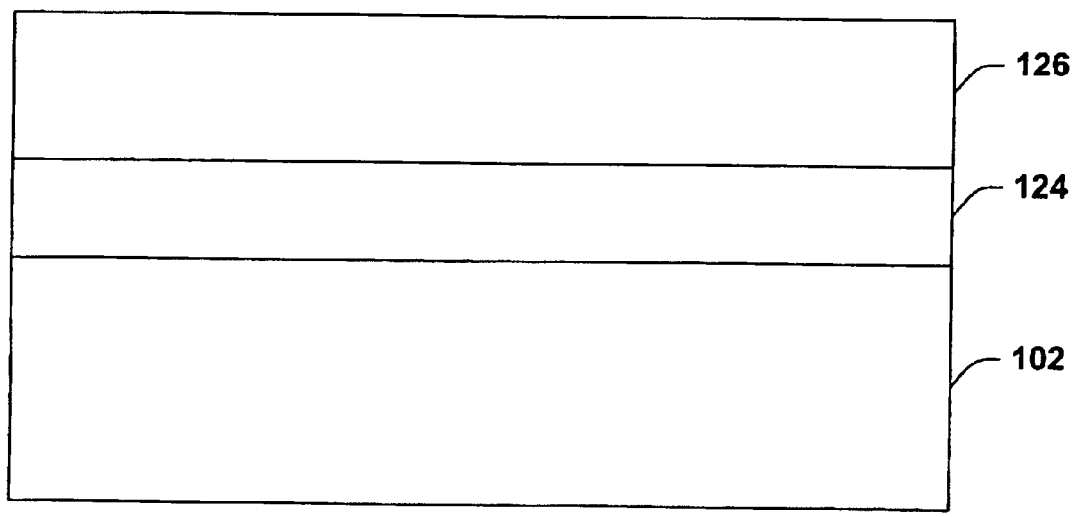
Figure 4:
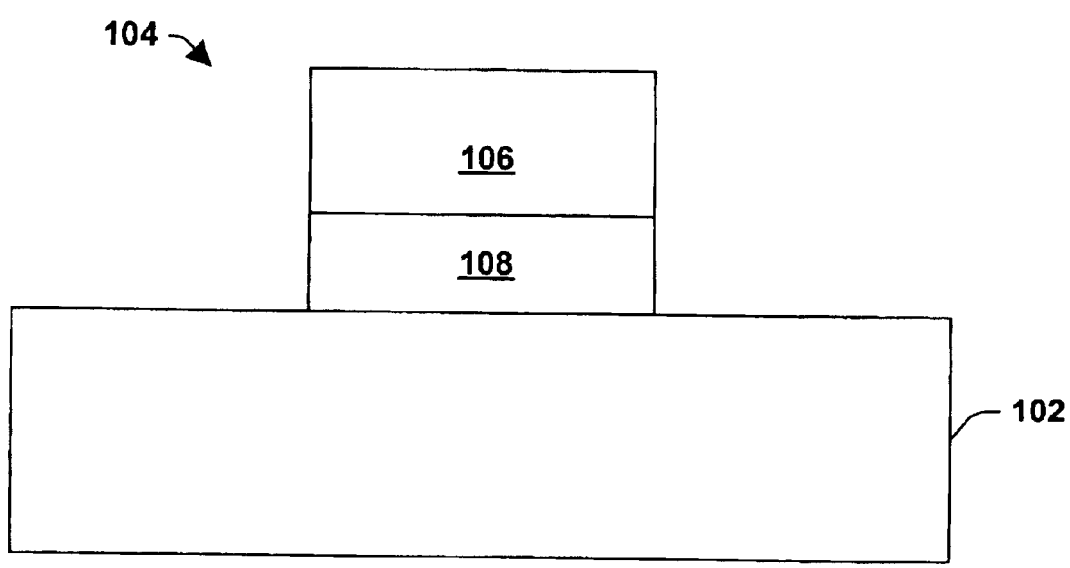
Figure 5:
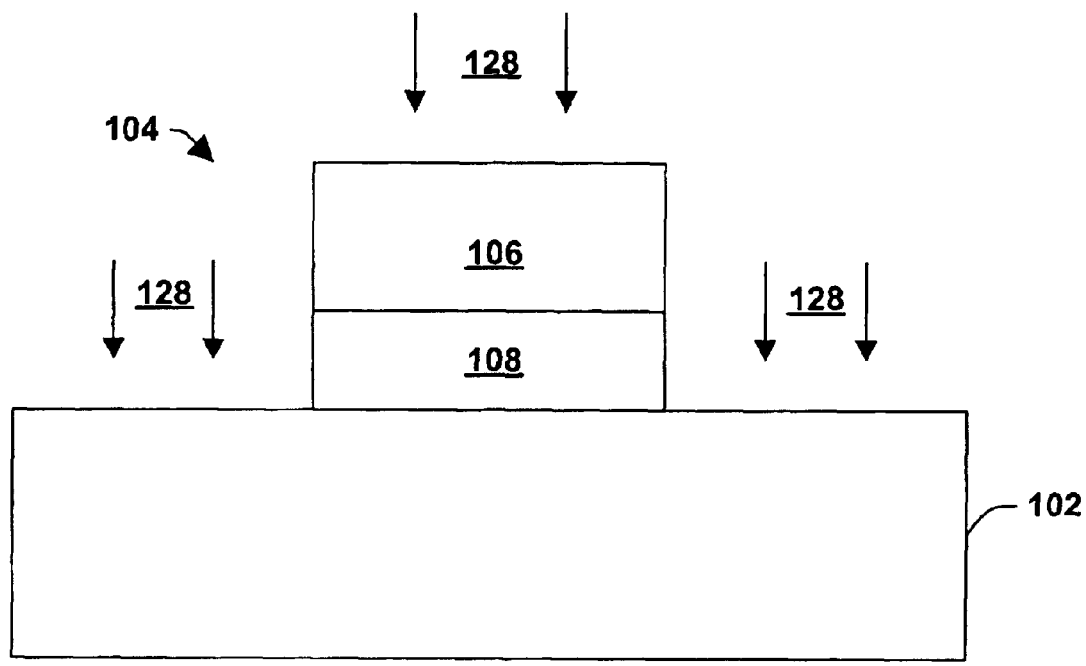
Figure 6:
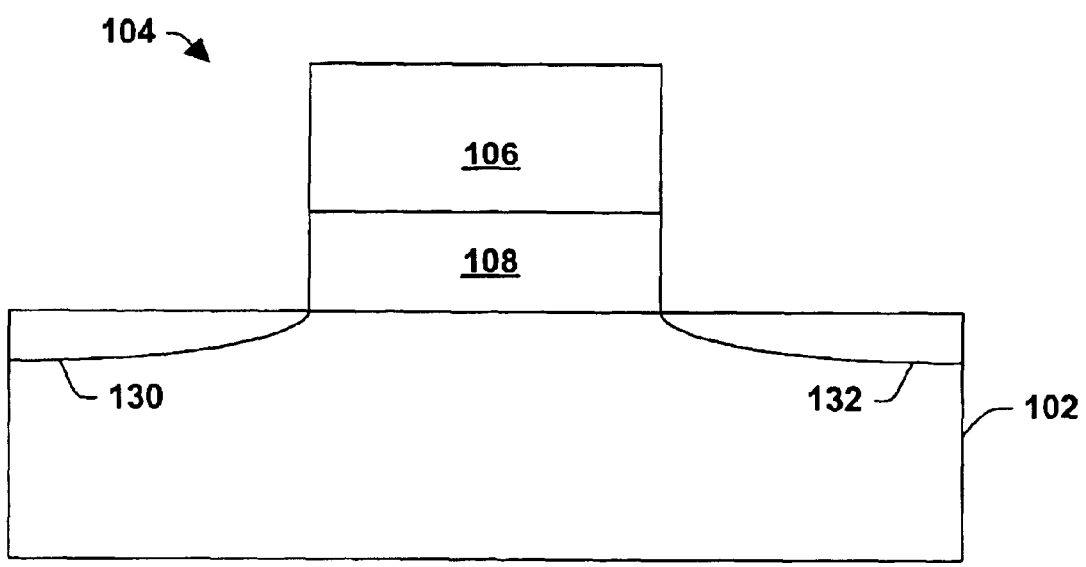

To form the device 100, a layer of dielectric material 124 is initially formed over the substrate 102 (FIG. 2). A gate electrode layer 126 (e.g., polysilicon or SiGe) is then formed over the layer of dielectric material 124 (FIG. 3). The gate electrode layer 126 and the layer of dielectric material 124 are then patterned (e.g., via etching) to develop the gate structure 104 (FIG. 4). Dopant 128 is then applied to the gate 106 and to exposed portions of the substrate 102 (FIG. 5) to form extension regions 130,132 therein (FIG. 6). As will become apparent, the extension regions 130, 132 are precursors to the source and drain regions 118, 120 formed within the substrate 102.

Figure 7:
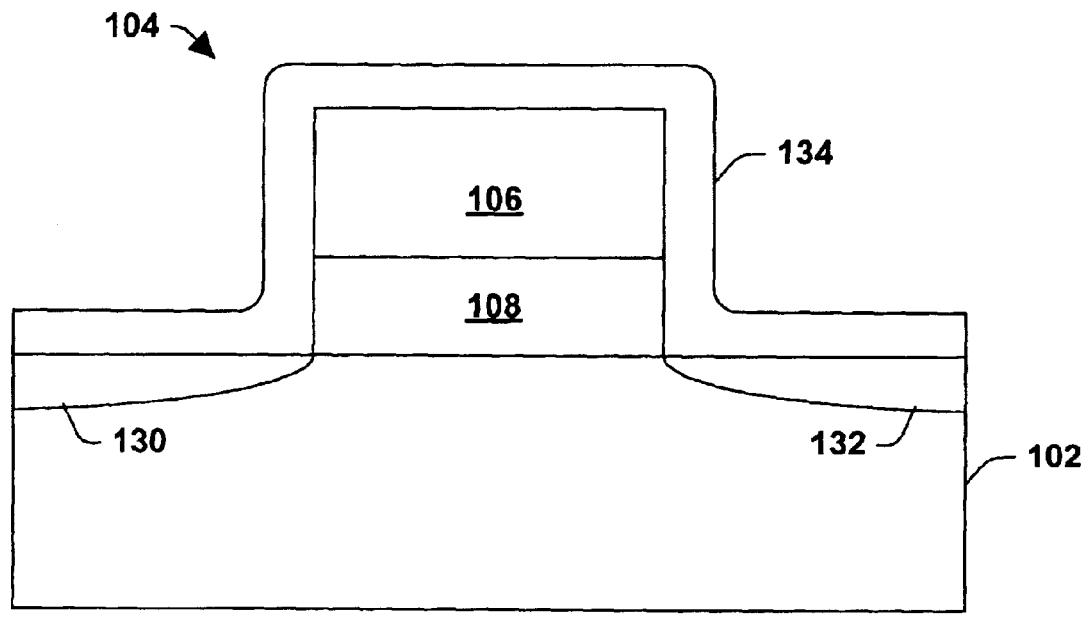
Figure 8:
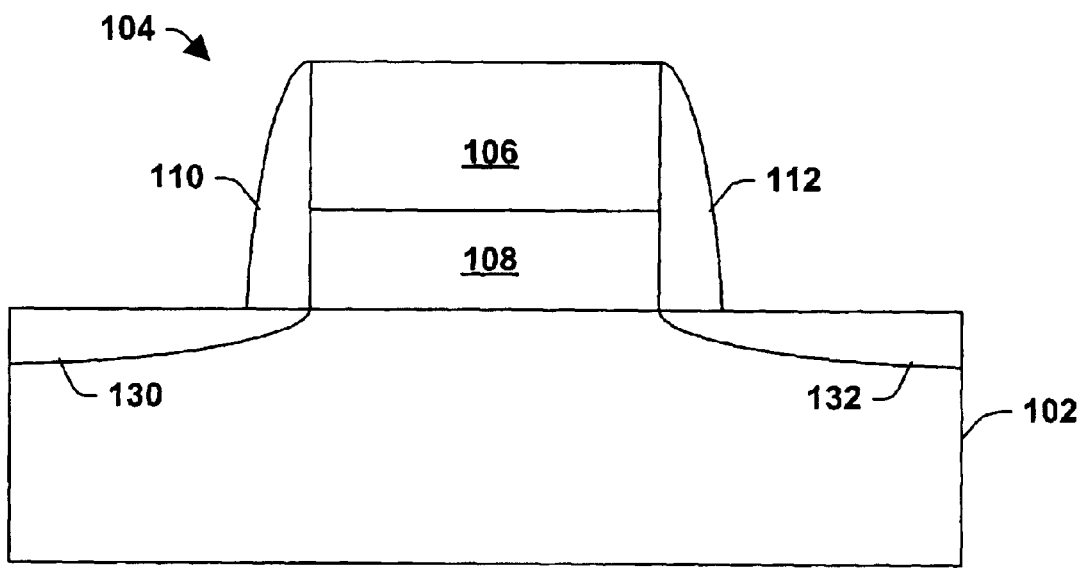
Figure 9:
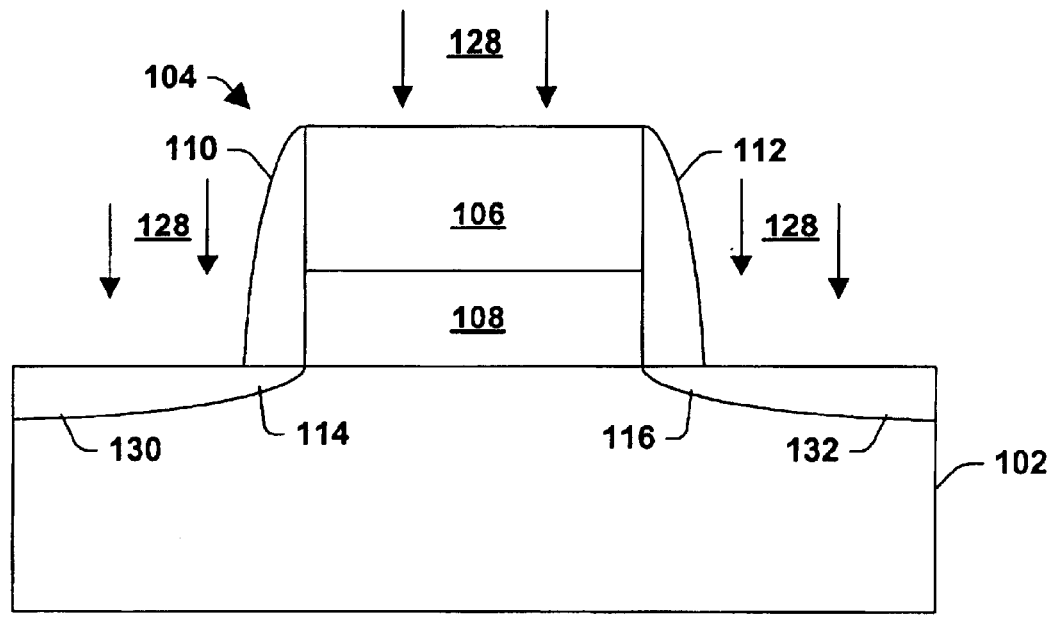
Figure 10:
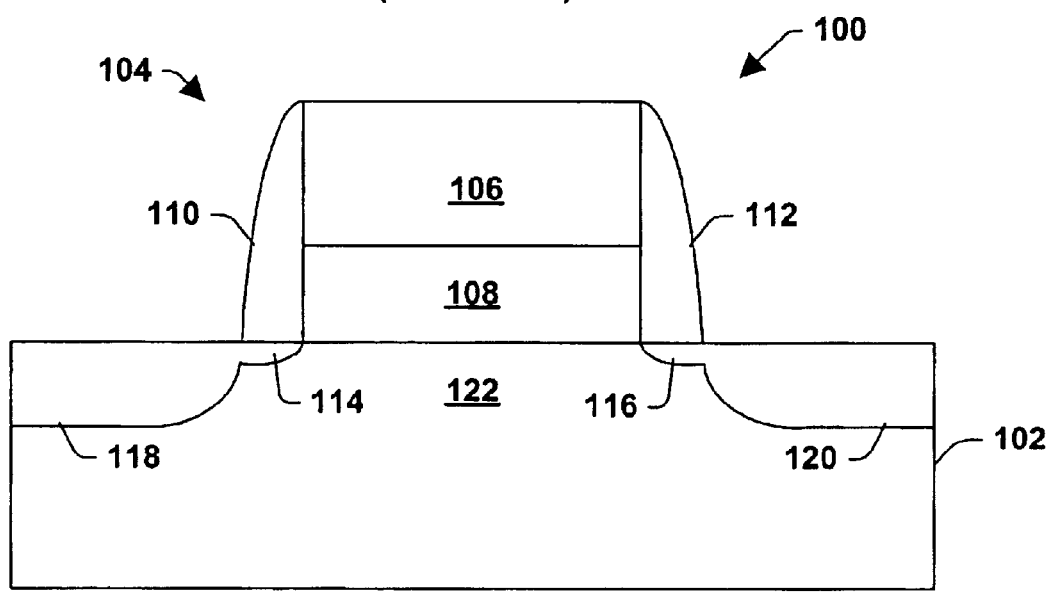

A layer of an insulating material 134 (e.g., silicon nitride, silicon oxide) is then formed over the entire structure (FIG. 7). The layer of insulating material 134 is selectively removed (e.g., via anisotropic etching) to form the sidewall spacers 110, 112 on either side of the gate structure 104 (FIG. 8). Additional dopant 128 is then applied to the gate 106 and the substrate 102, except for those portions 114, 116 covered by the sidewall spacers 110, 112 (FIG. 9). The additional dopant 128 establishes the source and drain regions 118, 120 within the substrate 102 on either side of the gate structure 104 (FIG. 10). It will be appreciated that the additional dopant 128 is of substantially the same type as that previously applied in forming the extension regions 130, 132 (e.g., FIG. 6). The channel region 122 is thereby defined within the substrate 102 under the gate structure 104 as the source and drain regions 118, 120 are formed (FIG. 10).

As previously mentioned, semiconductor devices, such as transistors, are continually being improved by, among other things, reducing sizes of components and/or layer thicknesses as well as increasing speeds of operation. As layer thicknesses are reduced, however, performance problems may develop. For example, as the thickness of a gate dielectric is scaled down, "tunneling" current may be observed through the dielectric. If the dielectric is scaled down to tens of angstroms, for example, charge carriers may be able to tunnel through the gate dielectric and into the channel. Basically, the thinner the dielectric, the greater the potential is for an increased tunneling current. When charge carriers tunnel through the gate dielectric, gate leakage current undesirably increases, resulting in increased static power dissipation and potentially degraded circuit operation. In addition, with charge carriers tunneling through the gate dielectric, decreased charge carrier accumulation in the channel of the transistor may result in an undesirable increase in channel resistance. Furthermore, with the thin gate dielectric, charge accumulation at the gate electrode causes an undesirable increase in charge carrier scattering at the surface of the channel of the device. Such an increase in charge carrier scattering in turn results in higher resistance through the channel of the transistor and reduced carrier mobility.

In light of these disadvantages, high-k dielectric materials can be utilized in forming gate dielectrics in MOS transistors. When a gate dielectric is comprised of a high-k dielectric material, the gate dielectric has an increased thickness. For example, conventional gate dielectrics (e.g., of silicon oxide ($SiO_2$)) can have thicknesses of about 2.5–5 nanometers, whereas high-k gate dielectrics have thicknesses on the order of tens of nanometers, yet exhibit comparable electrical performance to the thinner $SiO_2$. The larger thickness tends to minimize charge carrier tunneling through the gate dielectric. In particular, charge carrier tunneling through the gate dielectric can be minimized exponentially by the thickness of the gate dielectric.

While high-k dielectric materials can resolve some of the issues encountered with device scaling, other issues persist. For example, p-type dopant (e.g., boron) utilized to dope the gate electrode when fabricating a PMOS transistor can penetrate through the gate electrode (e.g., interstitially and/ or via vacancy diffusion) and into the gate dielectric. The gate dielectric is a poor barrier to impurities, and, as such, the dopant can find its way into the underlying channel region. The presence of dopant in the channel region or on or near the interface between the gate electrode and the gate dielectric can result in a number of undesirable issues, such as threshold voltage ($V_t$) instability, flatband voltage ($V_{fb}$) shift, channel mobility and subthreshold slope degradation, a lowering of charge breakdown ($Q_{BD}$), and an increase of trapping centers for p-channel devices.

The diffusion of dopant through the gate electrode is referred to as the depletion effect and is due, at least in part, to the fact that the gate electrode is generally comprised of polysilicon or SiGe. More particularly, the depletion effect occurs because polysilicon or SiGe does not have an infinite amount of carriers. Presently, polysilicon or SiGe can only be doped to a range of about $2E20/cm^3$ to about $3E20/cm^3$. As such, a substantially greater number of carriers (e.g., larger than about $5E21/cm^3$) are not present in the gate electrode, and when the gate is biased, a depletion region near the polysilicon or SiGe gate/gate dielectric interface is generated due to the lack of these carriers.

A semiconductor such as polysilicon or SiGe has a certain energy level measured conventionally by its Fermi level. The Fermi level of a material determines its work function, or the amount of energy required to move an electron from the material into a vacuum. The intrinsic Fermi level of an undoped semiconductor is at the middle of the bandgap between the conduction and valence band edges. In n-type doped silicon or SiGe, the Fermi level is closer to the conduction band than to the valence band (e.g., about 4.15 electron-volts). In p-type doped silicon or SiGe, the Fermi level is closer to the valence band than the conduction band (e.g., about 5.2 electron-volts). An appropriate work function facilitates tailoring the CMOS threshold voltage.

If the polysilicon or SiGe gate is not implanted to a high enough concentration, or if the implanted dopant is not sufficiently activated, a significant voltage is dropped across the gate electrode when a voltage is applied thereto. When the active carrier concentration in the polysilicon or SiGe is not high enough to maintain the Fermi level at the polysilicon or SiGe gate/gate dielectric at a desired level, band bending in the polysilicon or SiGe gate becomes voltage-dependent. As the device is biased such that the silicon substrate is inverted, the polysilicon or SiGe gate becomes depleted of free carriers. As the polysilicon or SiGe is driven into depletion, part of the applied voltage is dropped across the polysilicon or SiGe gate electrode, reducing the field at the interface and decreasing the channel carrier concentration. As a result, the drive current is reduced, thereby reducing the device's switching speed.

At inversion, a gate electrode of polysilicon or SiGe, for example, will generally experience a depletion of carriers in the area of the polysilicon or SiGe near the gate dielectric resulting in a reduced electric field at the surface of the semiconductor. The polysilicon or SiGe depletion effect is not as significant with gate dielectrics having thicknesses of 5 nm or more. However, as gate dielectric thicknesses decrease, the contribution of the voltage drop at inversion due to the role of the polysilicon or SiGe depletion effect on device performance becomes more significant.

It will be appreciated that the polysilicon or SiGe depletion effect also makes the gate dielectric appear electrically thicker than it actually is, and that this effect can become exaggerated as the size of the gate dielectric is reduced (e.g., to 3 nm and below). For example, the polysilicon or SiGe depletion effect causes the gate dielectric to electrically function as if it were from about 0.5 nm to about 1.5 nm thicker than the actual gate dielectric thickness. When the gate dielectric is on the order of 15 nm thick, 0.5 nm of additional thickness due to the depletion effect is not significant. However, when the gate dielectric thickness is about 5 nm and below, an additional operational thickness of 0.5 nm due to the polysilicon or SiGe depletion effect can have a significant impact on the device's operation and performance.

Another difficulty associated with device scaling is that thermal treatments are limited. Therefore, the polysilicon or SiGe gate electrode may be doped heavily (e.g., 2–3E20/cm$^3$), but the dopants are difficult to electrically activate due to the reduced thermal budgets. More particularly, dopants in a polysilicon or SiGe gate conductor can diffuse across the thin gate dielectric and into the underlying channel region during high-temperature processes such as implant anneals. Such diffusion can leave a region of low carrier concentration in the polysilicon or SiGe directly above the gate dielectric. This region of the gate conductor adjacent to the gate dielectric therefore has a higher resistivity, and the resulting device performs as if it had an increased gate dielectric thickness. Also, since polysilicon or SiGe material cannot be doped or dopants activated at levels higher than about 2–3E20/cm$^3$, scaling the gate length produces a gate resistance. Therefore, a higher than desirable electrical sheet resistance or resistivity for polysilicon or SiGe arises and produces unacceptable large time delays in the circuits due to the RC time constant formed.

Figure 11:
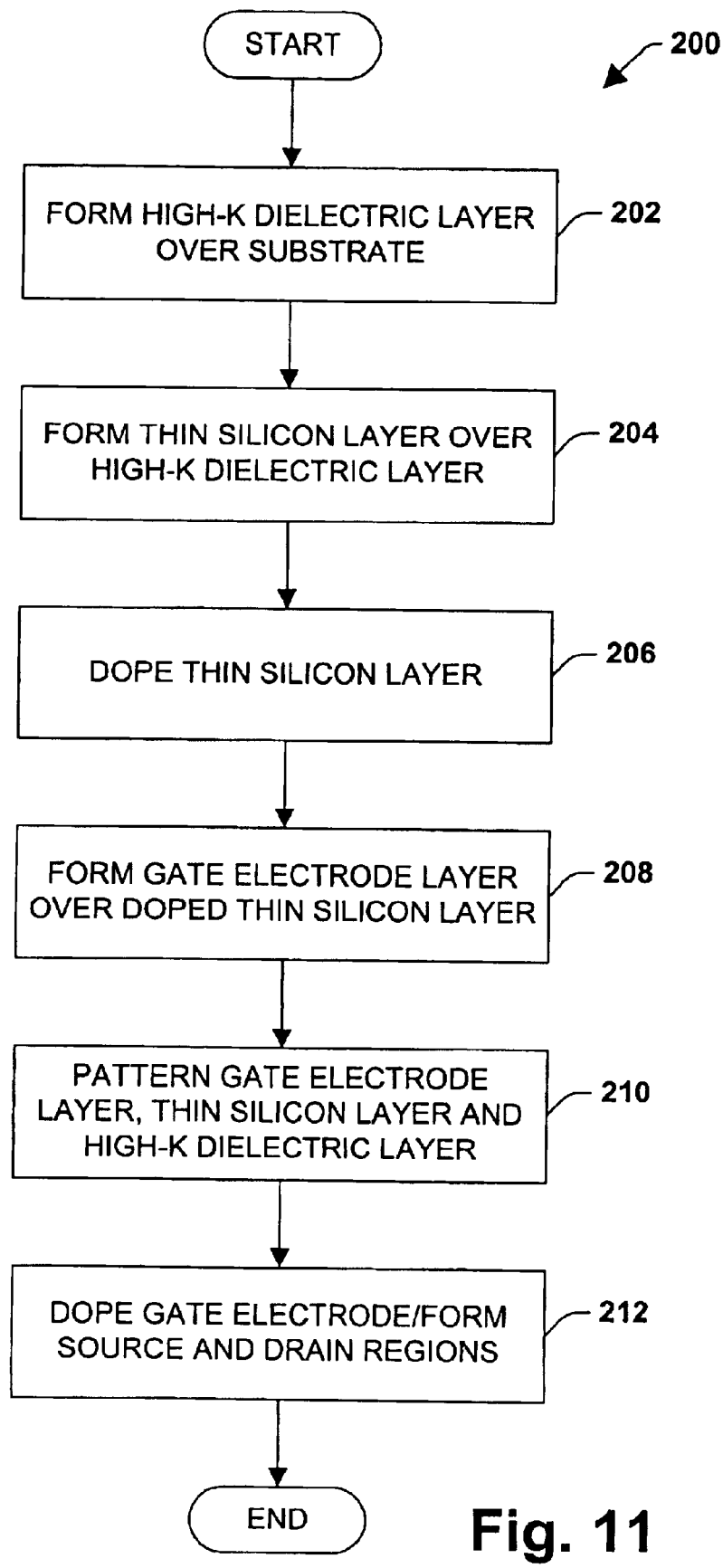
FIG. 11 is a flow diagram illustrating an example of a methodology of forming a PMOS transistor in accordance with one or more aspects of the present invention.

Turning now to FIG. 11, a methodology 200 is illustrated for forming a PMOS transistor according to one or more aspects of the present invention. The PMOS transistor is fabricated as having an associated work function by isolating a gate dielectric from a p-type dopant added to a gate electrode overlying the gate dielectric. Although the methodology 200 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated. By way of example, the method or variants thereof may be used according to one or more aspects of the present invention in the fabrication of a transistor as illustrated and described below with respect to FIGS. 12–23.

The methodology 200 begins at 202 wherein a layer of gate dielectric material is formed over a semiconductor substrate. The gate dielectric material can be applied to the substrate in any number of ways, such as with spin-on techniques, sputtering techniques (e.g., magnetron or ion beam sputtering), growth and/or deposition techniques such as chemical vapor deposition (CVD), for example. The gate dielectric material can be formed to a thickness of about 10 nanometers or more, and can have an equivalent oxide thickness (EOT) of about 10 nanometers or less, for example. The substrate generally includes silicon, and the gate dielectric material generally comprises a material having a dielectric constant higher than about 3.9 (e.g., higher than silicon dioxide ($SiO_2$)). Such high-k materials can include, for example, any one or more of the following, either alone or in combination: aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, PST, PZN, PZT and PMN.

The methodology 200 then proceeds to 204 wherein a thin layer of silicon or SiGe is formed over the layer of gate dielectric material. This layer can comprise polysilicon or SiGe and/or amorphous silicon or SiGe and can be formed to a thickness of about 5 to 120 nanometers, for example. The layer of silicon or SiGe can be formed across the gate material in any suitable manner, such as sputtering techniques (e.g., magnetron or ion beam sputtering), growth and/or deposition techniques, for example. The thin layer of silicon or SiGe is then doped at 206 so as to inhibit p-type dopant (to which the barrier layer may subsequently be exposed) from passing through the silicon or SiGe layer and into the underlying layer of gate dielectric material. The dopant can include indium (In), for example. It will be appreciated that the dopant may have a peak concentration within the layer of silicon or SiGe at a location where the silicon or SiGe material and the gate dielectric material interface with one another.

The methodology then advances to 208 wherein a gate electrode layer is formed on the doped thin layer of silicon or SiGe. The gate electrode layer generally includes polysilicon or SiGe, and can be formed to a thickness of about 50–200 nm, for example. The gate electrode layer can be formed across the thin layer of silicon or SiGe in any suitable manner, such as with growth, deposition or sputtering, for example.

At 210, the gate electrode layer, the thin layer of silicon or SiGe and the layer of gate dielectric material are patterned to form a gate structure. The gate structure thus comprises a gate electrode, a silicon or SiGe layer and a gate dielectric. The layers can be patterned in any suitable manner to form the gate structure, such as by etching, for example. After the patterning, the methodology proceeds to 212 wherein p-type dopant such as boron is applied to the gate electrode and portions of the substrate not covered by the gate structure. Doping the gate electrode facilitates forming the transistor with an associated work function that has a desired value (e.g., coincident with a Fermi level of about 4.8 to about 5.6 electron volts). Doping the exposed portions of the substrate establishes source and drain regions within the substrate. The source and drain regions are adjacent the gate structure and define a channel region within the substrate under the gate structure. The p-type dopant can be boron (B), for example, and can be applied to the gate electrode to about 2–3E20/cm$^3$ or more. The methodology ends after the gate electrode has been doped and the source and drain regions are formed.

It should be understood that the doping of the gate and the formation of source/drain regions may be performed together or may be decoupled into separate operations, as may be desired. In addition, extension regions may be formed followed by formation of sidewall spacers prior to source/drain formation, if desired, and such variations are contemplated as falling within the scope of the present invention.

Turning now to FIGS. 12–23, in accordance with one or more aspects of the present invention, an example of a methodology of forming a PMOS transistor 300 is provided. The transistor 300 is formed upon a semiconductor substrate 302, and is depicted in FIGS. 12–23 with reference to cross-sectional views of the transistor 300 at various stages of development.

Figure 12:
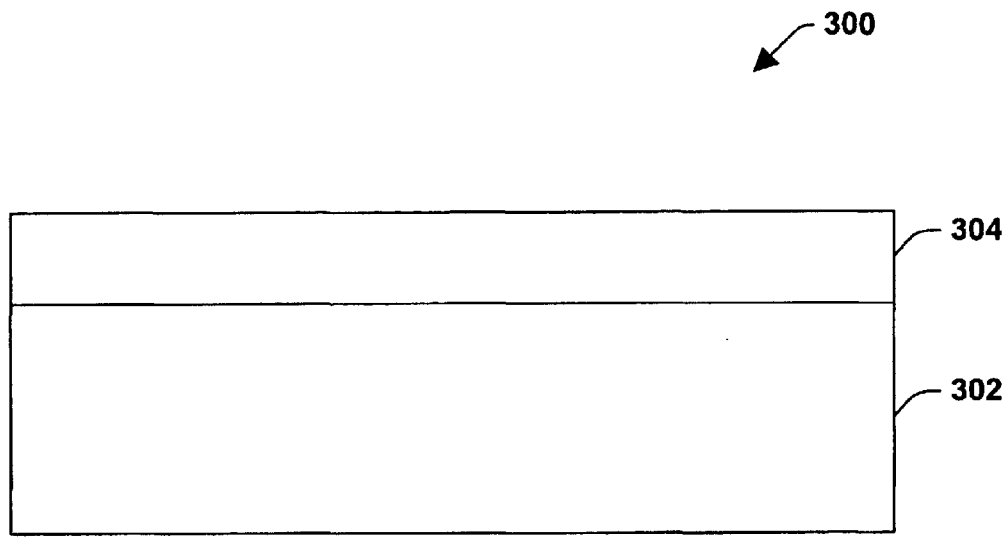
FIGS. 12–23 are cross-sectional illustrations of a PMOS transistor formed according to one or more aspects of the present invention.

Initially, a layer of gate dielectric material 304 is formed over the substrate 302 (FIG. 12). The substrate 302 generally comprises silicon, while the layer of gate dielectric material 304 can include any of a number of suitable materials. Table 1 below illustrates examples of some gate dielectric materials.

TABLE 1

| Dielectric Material | Approximate Relative Permittivity (k) |
| --- | --- |
| silicon dioxide | 3.9 |
| silicon oxynitride | 4–6 |
| aluminum oxide ($Al_2O_3$) | 9–10 |
| zirconium silicate | 12 |
| hafnium silicate | 15 |
| hafnium silicon oxynitride | 16 |
| zirconium silicon oxynitride | 16 |
| hafnium silicon nitride | 18 |
| lanthanum oxide ($La_2O_3$) | 20–30 |
| hafnium oxide ($HfO_2$) | 25 |
| hafnium oxynitride | 30 |
| zirconium oxide ($ZrO_2$) | 25 |
| zirconium oxynitride | 30 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | about 20–about 200 |
| barium strontium oxide ($Ba_{1-x}Sr_xO_3$) | about 20–about 200 |
| $PbTiO_3$ | about 20–about 200 |
| barium titanate ($BaTiO_3$) | about 20–about 200 |
| strontium titanate $SrTiO_3$ | about 20–about 200 |
| $PbZrO_3$ | about 20–about 200 |
| PST ($PbSc_xTa_{1-x}O_3$) | 3000 |
| PZN ($PbZn_xNb_{1-x}O_3$) | about 500–about 5000 |
| PZT ($PbZr_xTi_{1-x}O_3$) | about 150–about 1000 |
| PMN ($PbMg_xNb_{1-x}O_3$) | about 500–about 5000 |

It will be appreciated that Table 1 is not an exhaustive list of gate dielectric materials and that other gate materials may be available. It will be further appreciated that the k-values for both standards and high-k materials may vary to some degree depending on the exact nature of the dielectric material. Thus, for example, differences in purity, crystallinity and stoichiometry, may give rise to variations in the exact k-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is not intended unless explicitly stated. As will be understood by those of skill in the art, such variations may occur naturally, or may be sought and controlled by selection and control of the conditions under which materials are formed.

It will be appreciated that the layer of gate dielectric material 304 can be formed across the substrate 302 in any of a number of suitable manners, including, for example, sputtering techniques (e.g., magnetron or ion beam sputtering), growth and/or deposition techniques, such as chemical vapor deposition (CVD). Additionally, the high-k dielectric material can be formed to a thickness of about 2.0 nanometers or more to mitigate "tunneling", and can have an equivalent oxide thickness (EOT) of about 2.0 nanometers or less, for example, so as to maintain and exhibit desired electrical properties. A high-k dielectric material having a k of about 7.8 and a thickness of about 10 nm, for example, is substantially electrically equivalent to an oxide gate dielectric having a k of about 3.9 and a thickness of about 5 nm.

Figure 13:
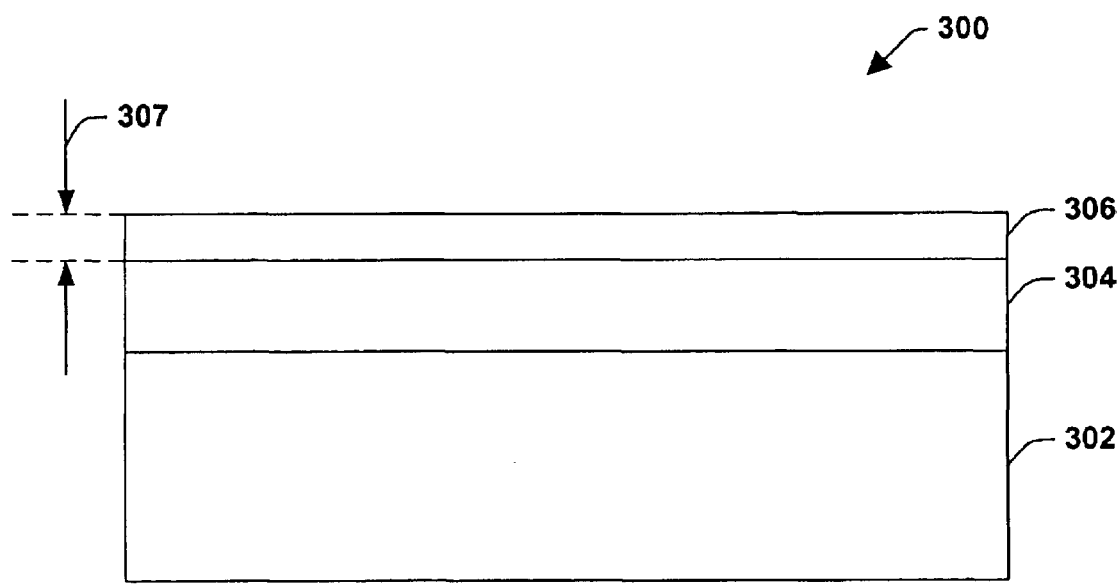
Figure 14:
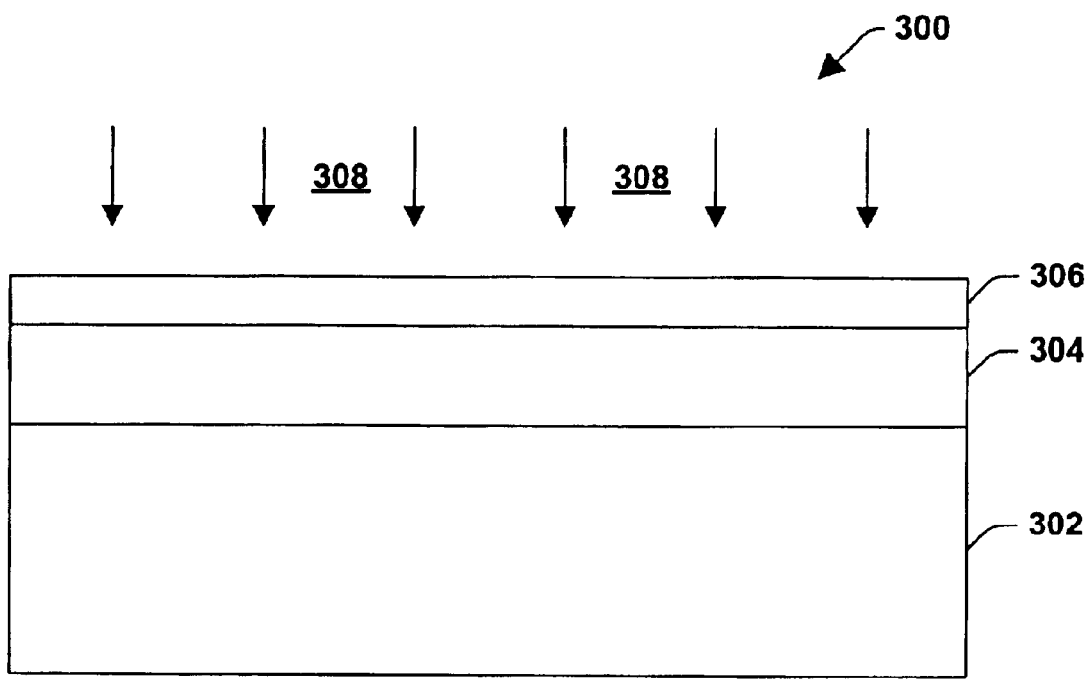
Figure 15:
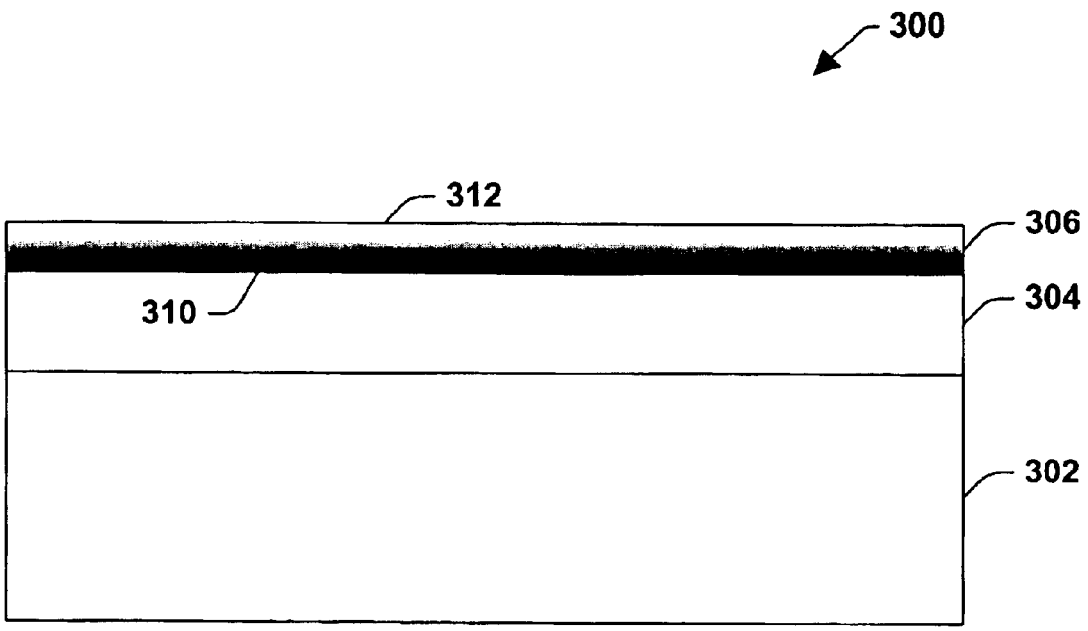

A thin layer of silicon or SiGe 306 is then formed over the layer of gate dielectric material (FIG. 13). This layer can comprise polysilicon or SiGe and/or amorphous silicon or SiGe and can be formed to a thickness 307 of about 5 to 120 nanometers, for example. The layer of silicon or SiGe can be formed across the gate material in any suitable manner, such as sputtering techniques (e.g., magnetron or ion beam sputtering), growth and/or deposition techniques, for example. A dopant 308 is then applied to the thin layer of silicon or SiGe 306 (FIG. 14). The thin layer of silicon or SiGe 306 has a bottom surface 310 that faces the gate dielectric layer 304 and a top surface 312 that faces material subsequently formed thereover (FIG. 15). It will be appreciated that the dopant 308 may have a peak concentration near the bottom surface 310 of the silicon or SiGe layer 306 (depicted as a gradient of shading). The dopant 308 can include indium (In), for example, and serves to inhibit p-type dopant such as boron from passing through the silicon or SiGe layer 306 and into the underlying layer of gate dielectric material 304. Such p-type dopant can be utilized, for example, to dope an overlying gate electrode (as is discussed greater detail below).

Having the peak indium concentration near to interface 310 helps to block boron from penetrating the gate dielectric. Gate electrode depletion, interface defects, bulk defects and Fermi level changes in the substrate are reduced when boron diffusion is blocked at the gate dielectric/gate electrode interface. Since the atomic radius of indium is much large than that of boron (167 pm for indium compared to 85 pm for boron), the diffusivity of indium in silicon is much less that that of boron in silicon ($4 \times 10^{-15}$ $cm^2/s$ for indium compared to $9 \times 10^{-15}$ for boron). If indium is maximized at the gate dielectric/gate electrode interface, indium will be fixed at this interface owing to its low diffusivity while occupying the lattice sites needed for boron diffusion thus preventing boron from penetrating the gate dielectric in sufficient amount to cause poly depletion or a threshold voltage shift.

Figure 16:
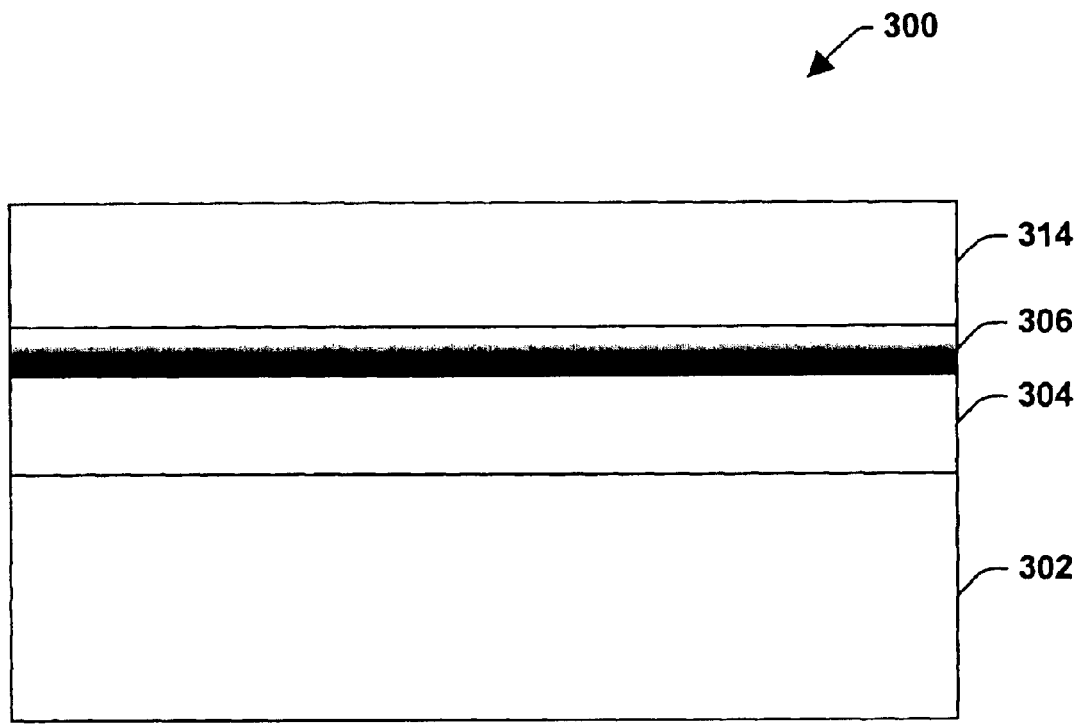

A gate electrode layer 314 is then formed over the thin layer of silicon or SiGe 306 (e.g., via spin-on, sputtering, deposition, growth techniques, etc.) (FIG. 16). The gate electrode layer generally includes polysilicon or SiGe, and can be formed to a thickness of about 200 nanometers or less, for example. The gate electrode layer 314 ultimately yields a contact that provides a means for applying a voltage to the transistor 300 or otherwise biasing the transistor 300.

Figure 17:
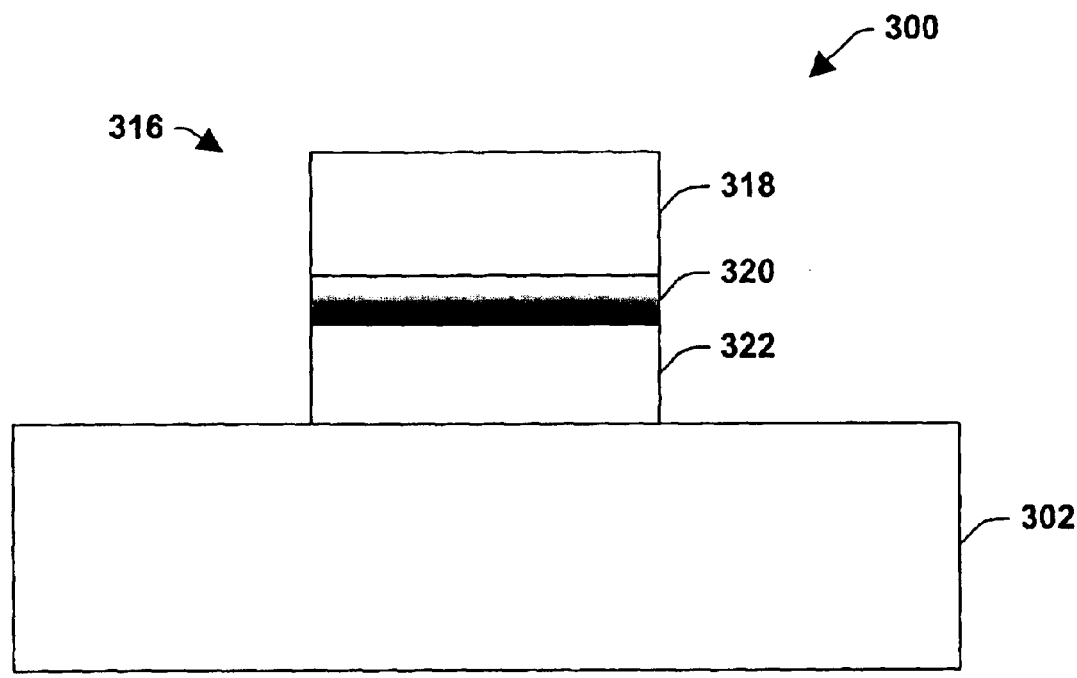

The gate electrode layer 314, thin layer of silicon or SiGe 306 and the layer of gate dielectric material 304 are then patterned to form a gate structure 316 (FIG. 17). The gate structure 316 thus comprises a gate electrode 318, a silicon or SiGe layer 320 and a gate dielectric 322. The layers can be patterned in any suitable manner to form the gate structure 316, such as by etching, for example.

Figure 18:
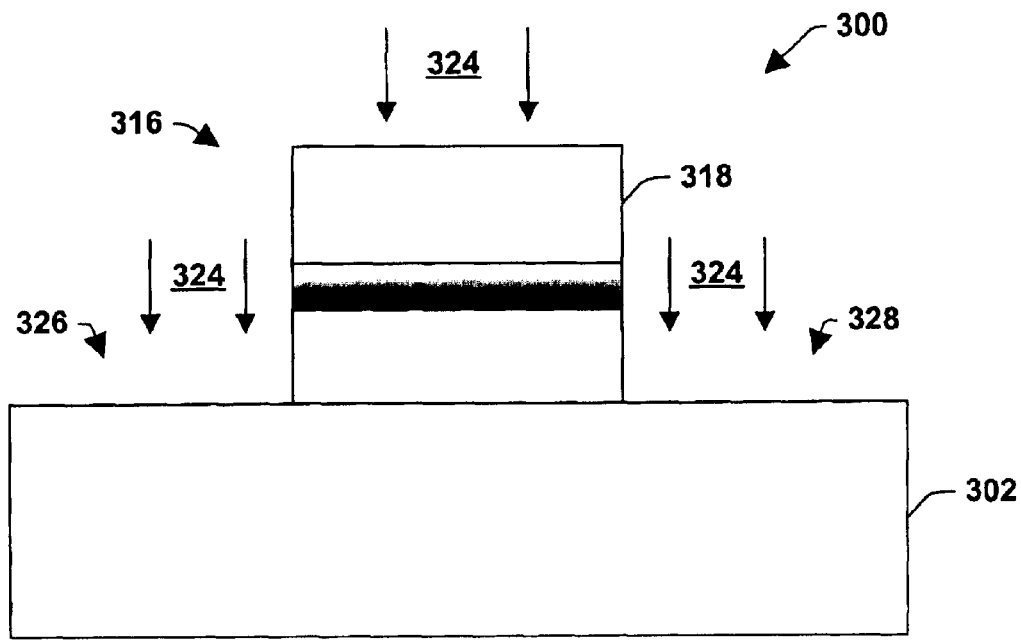
Figure 19:
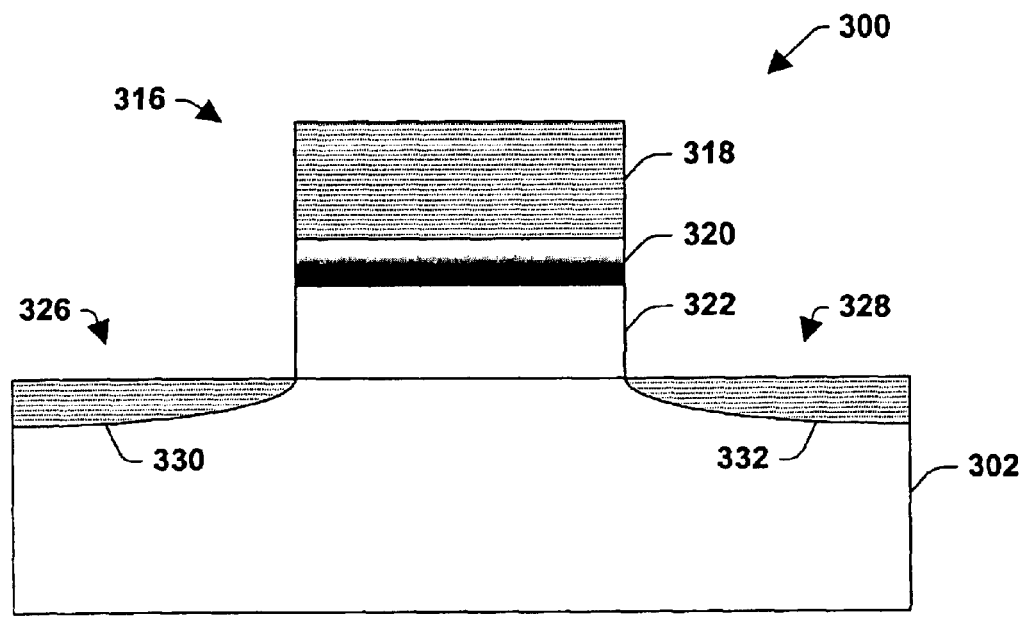

After the patterning, a p-type dopant 324 is applied to the gate electrode 318 as well as to portions of the substrate 326, 328 not covered by the gate structure 316 (FIG. 18). The p-type dopant can be applied to about 2–3E20/cm$^3$ or less, for example, to lightly dope the gate electrode 318 (depicted as lightly shaded) and to form extension regions 330, 332 in the exposed portions of the substrate 326, 328 (FIG. 19).

Figure 20:
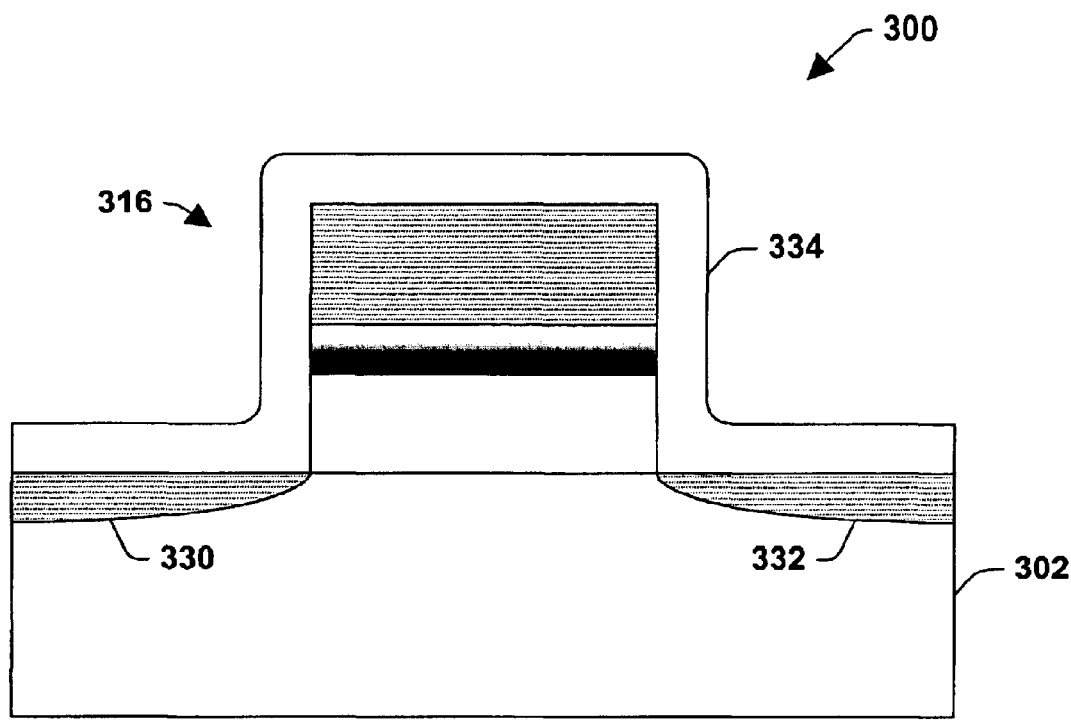
Figure 21:
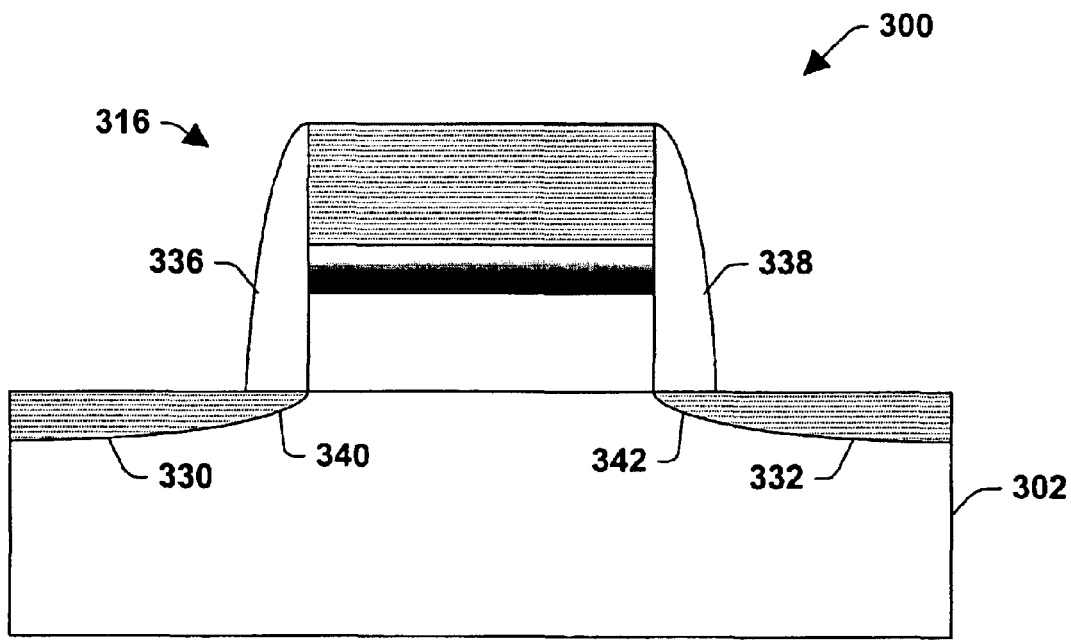
Figure 22:
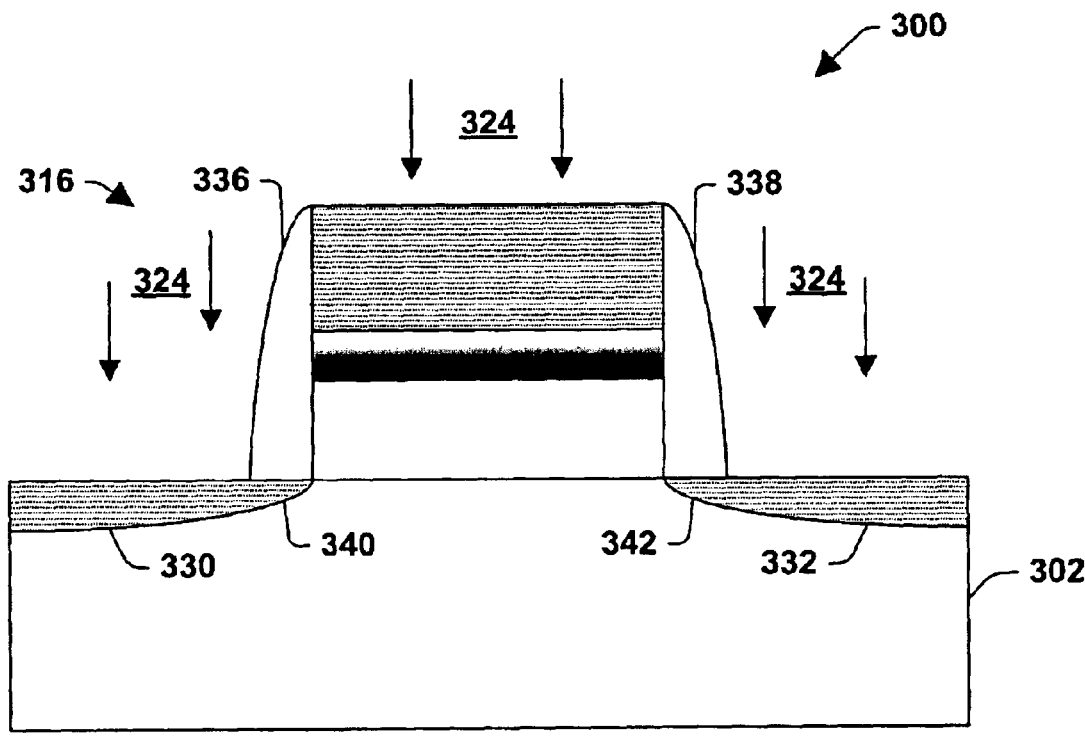
Figure 23:
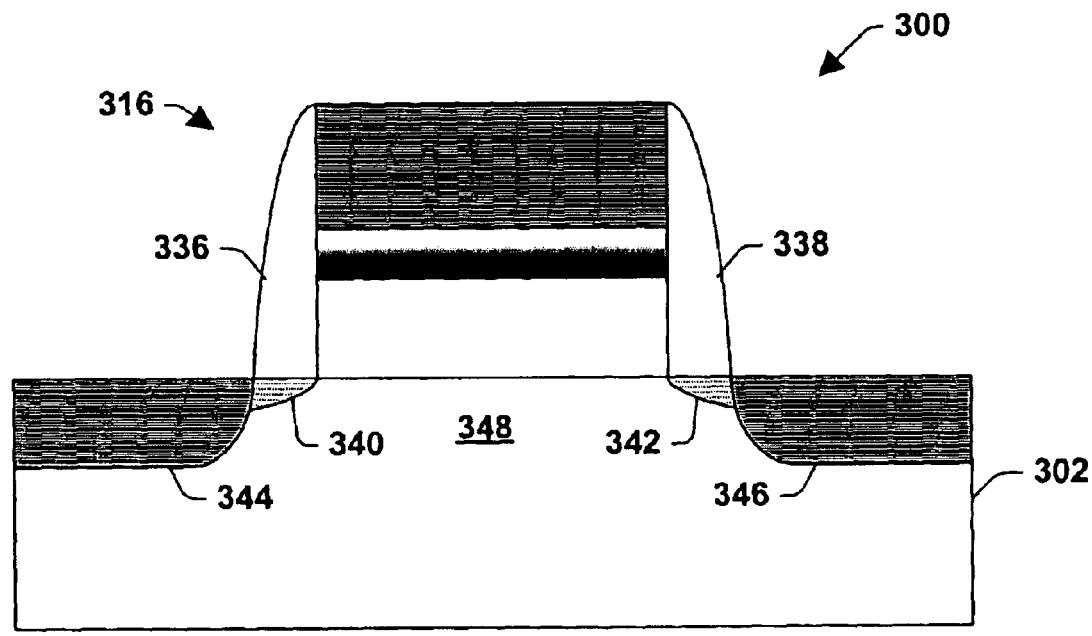

A layer of an insulating material 334 (e.g., silicon nitride, silicon oxide) is then formed over the entire structure (FIG. 20). The layer of insulating material 334 is selectively removed (e.g., via anisotropic etching) to form sidewall spacers 336, 338 on either side of the gate structure 316 (FIG. 21). The sidewall spacers 336, 338 cover portions 340, 342 of the extension regions 330, 332 and deter subsequently applied dopant from entering these portions 340, 342. Additional p-type dopant 324 is then applied (FIG. 22) to establish source and drain regions 344, 346 within the substrate 302 on either side of the gate structure 316 and to more heavily dope gate structure 318 (as depicted with darker shading) (FIG. 23). Preferably, the additional dopant 324 is of substantially the same type (e.g., boron) as that previously applied in forming the extension regions 330, 332 and lightly doping the gate electrode 318 (e.g., FIG. 19). The gate electrode 318 can be implanted to about 2–3E20/cm$^3$ or more, for example, with the additional dopant 324. This heavier doping facilitates establishing the transistor 300 with a desired work function, such as coincident with a Fermi level of about 4.8 to about 5.6 electron volts, for example. A channel region 348 is defined within the substrate 302 under the gate structure 316 as the source and drain regions 344, 346 are formed within the substrate 302.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A PMOS transistor comprising:
   a source region formed within a substrate;
   a drain region formed within the substrate;
   a channel region defined within the substrate between the source and drain regions;
   a gate dielectric formed over the channel region;
   a boron doped gate electrode formed over the gate dielectric; and
   an indium doped SiGe layer formed between said gate dielectric and said gate electrode, wherein said indium doped SiGe layer will inhibit boron from entering into the gate dielectric for the boron doped gate electrode.

2. The PMOS transistor of claim 1, wherein the silicon or SiGe layer has a thickness of about 5 to 120 nanometers.

3. The transistor of claim 1, wherein the gate electrode is doped with boron to about 2–3E20/cm$^3$ or more.

4. The transistor of claim 1, wherein the gate electrode is doped with boron to establish the desired work function coincident with a Fermi level of about 4.8 to about 5.6 electron volts.

* * * * *